(12) United States Patent
Frohberg et al.

(10) Patent No.: US 7,833,874 B2
(45) Date of Patent: Nov. 16, 2010

(54) TECHNIQUE FOR FORMING AN ISOLATION TRENCH AS A STRESS SOURCE FOR STRAIN ENGINEERING

(75) Inventors: Kai Frohberg, Niederau (DE); Patrick Press, Dresden (DE); Thomas Werner, Reichenberg (DE)

(73) Assignee: Globalfoundries Inc., Grand Cayman (KY)

( * ) Notice: Subject to any disclaimer, the term of this patent is extended or adjusted under 35 U.S.C. 154(b) by 525 days.

(21) Appl. No.: 11/534,726

(22) Filed: Sep. 25, 2006

(65) Prior Publication Data

US 2007/0155121 A1    Jul. 5, 2007

(30) Foreign Application Priority Data

Dec. 30, 2005    (DE) ............... 10 2005 063 108

(51) Int. Cl.
    *H01L 21/76* (2006.01)
(52) U.S. Cl. ............ 438/424; 438/433; 438/435; 257/E21.632; 257/E29.242
(58) Field of Classification Search ........ 257/510, 257/513, 515, E21.632, E29.242; 438/424, 438/433, 435
See application file for complete search history.

(56) References Cited

U.S. PATENT DOCUMENTS

| 2004/0087079 A1* | 5/2004 | Chen et al. | 438/216 |
| 2004/0212035 A1* | 10/2004 | Yeo et al. | 257/510 |
| 2005/0008790 A1* | 1/2005 | Kapoor et al. | 427/569 |
| 2005/0139949 A1* | 6/2005 | Lee | 257/506 |
| 2007/0015347 A1* | 1/2007 | Mehta et al. | 438/514 |
| 2007/0032039 A1* | 2/2007 | Chen et al. | 438/435 |

OTHER PUBLICATIONS

Taylor, S; Zhang, JF; Eccleston, W; "A review of the plasma oxidation of silicon and its application", Semicond. Sci. Technol. 8 (1993) 1426-1433.*

* cited by examiner

*Primary Examiner*—David S Blum
(74) *Attorney, Agent, or Firm*—Williams, Morgan & Amerson, P.C.

(57) ABSTRACT

By forming a non-oxidizable liner in an isolation trench and selectively modifying the liner within the isolation trench, the stress characteristics of the isolation trench may be adjusted. In one embodiment, a high compressive stress may be obtained by treating the liner with an ion bombardment and subsequently exposing the device to an oxidizing ambient at elevated temperatures, thereby incorporating silicon dioxide into the non-oxidizable material. Hence, an increased compressive stress may be generated within the non-oxidizable layer.

12 Claims, 6 Drawing Sheets

TECHNIQUE FOR FORMING AN ISOLATION TRENCH AS A STRESS SOURCE FOR STRAIN ENGINEERING

BACKGROUND OF THE INVENTION

1. Field of the Invention

Generally, the present invention relates to the formation of integrated circuits, and, more particularly, to the formation of isolation trenches that may be used as strain-inducing sources of transistors having strained channel regions to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length may usually also require reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of highly complex process techniques concerning the above-identified process steps, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 50% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow to form the germanium or carbon-containing stress layers at appropriate locations in or below the channel region. Hence, process complexity is significantly increased, thereby also increasing production costs and the potential for a reduction in production yield.

Thus, in other approaches, external stress created by, for instance, overlaying layers, spacer elements and the like is used in an attempt to create a desired strain within the channel region. However, the process of creating the strain in the channel region by applying a specified external stress may suffer from an inefficient translation of the external stress into strain in the channel region. Hence, although providing significant advantages over the above-discussed approach requiring additional stress layers within the channel region, the efficiency of the stress transfer mechanism may depend on the process and device specifics and may result in a reduced performance gain for one type transistor.

In another approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked, and the silicon/germanium layer is subsequently selectively formed in the PMOS transistor by epitaxial growth. Although this technique offers significant advantages in view of performance gain of the PMOS transistor and thus of the entire CMOS device, an appropriate design may have to be used that balances the difference in performance gain of the PMOS transistor and the NMOS transistor.

In view of the above-described situation, there exists a need for an improved technique that enables efficiently increasing the performance of MOS transistors, while substantially avoiding or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that provides an alternative or additional stress source for creating a respective strain in a transistor element, while avoiding at least some of the problems identified above. For this purpose, the isolation trenches used in sophisticated semiconductor devices may be used to provide, in whole or part, a desired high compressive stress. In other illustrative embodiments, additionally or alternatively, an efficient stress engineering may be provided in which a different magnitude and/or type of intrinsic stress in respective isolation trenches may be generated. Since the trench isolation structure is located close to the respective transistor elements, an efficient stress transfer mechanism is provided, wherein, according to the present invention, a high degree of compatibility with conventional process strategies may be maintained.

According to one illustrative embodiment of the present invention, a method comprises forming a non-oxidizable layer within an isolation trench formed in a semiconductor layer that is located above a substrate. Moreover, the method comprises selectively modifying the non-oxidizable layer within the isolation trench to generate compressive stress. Moreover, the isolation trench is filled with an insulating material and finally a transistor element is formed adjacent to the isolation trench, wherein the compressive stress induces a lattice strain in the transistor element.

According to another illustrative embodiment of the present invention, a method comprises depositing a non-oxidizable layer having an intrinsic stress above a first isolation trench and a second isolation trench, wherein the first and the second isolation trenches are formed in a semiconductor layer. Furthermore, the intrinsic stress in the first isolation trench is selectively modified and the first and second isolation trenches are then filled with an insulating material.

In accordance with yet another illustrative embodiment of the present invention, a semiconductor device comprises a first isolation trench formed in a semiconductor layer and having sidewalls and a bottom side. An insulating liner material is formed on the sidewalls on the bottom side, wherein the insulating liner material comprises silicon, nitrogen and oxygen and has a compressive intrinsic stress. Finally, the semiconductor device comprises an insulating oxide material formed adjacent to the insulating liner material to fill the isolation trench.

BRIEF DESCRIPTION OF THE DRAWINGS

The invention may be understood by reference to the following description taken in conjunction with the accompanying drawings, in which like reference numerals identify like elements, and in which.

Figure 1A:
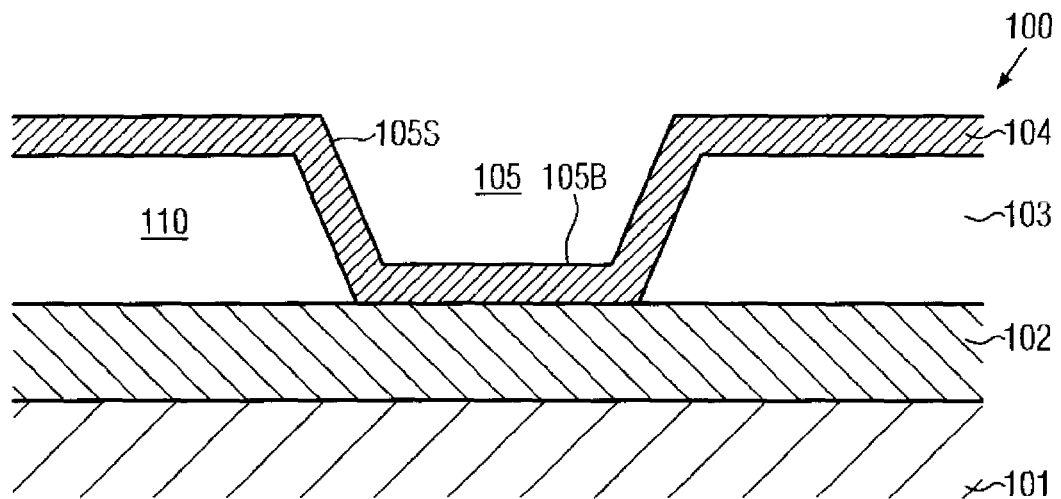
FIGS. 1a-1f schematically show cross-sectional views of a semiconductor device during the formation of an isolation trench having a compressive stress in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the concept that efficient strain engineering may be achieved by using stress produced in respective isolation trenches as an efficient stress source. Due to the ever decreasing feature sizes of advanced semiconductor devices, transistor elements may be located close to the respective trench isolations so that any increased stress created by the isolation trenches may be advantageously used in creating a respective strain in the channel region of the transistor element, thereby improving the performance thereof, as is discussed above. It should be appreciated that the principles of the present invention as have been pointed out above and as will be discussed in more detail later on may be advantageously applied to any specific device architecture, including the formation of transistor elements in bulk semiconductor substrates. The present invention is highly advantageous in the context of silicon-on-insulator (SOI) architectures, since here typically the isolation trenches extend down to the buried insulating layer, thereby providing the potential for creating a desired stress that may be continuously transferred along the entire depth of the transistor active region and even along the interface of the active region and the buried insulating layer. Consequently, even in highly sophisticated applications, in which in some cases the interface between the active region and the buried insulating layer may also serve as a channel region, an efficient stress transfer may be accomplished. For this purpose, the present invention employs process techniques that may not unduly contribute to process complexity so as to still provide a high degree of compatibility to existing conventional manufacturing techniques.

With reference to FIGS. 1a-1f, 2 and 3a-3d, further illustrative embodiments of the present invention will now be described in more detail. FIG. 1a schematically shows a cross-sectional view of a semiconductor device 100 comprising a substrate 101, which may represent any appropriate carrier for receiving or having formed therein an appropriate semiconductor layer 103, such as a silicon layer, a silicon/germanium layer and the like. In one illustrative embodiment, the semiconductor layer 103 may represent a silicon-based semiconductor layer having a thickness that is appropriate for the formation of fully or partially depleted SOI transistor elements therein. It should be appreciated that a silicon-based semiconductor layer is to be understood as a crystalline semiconductor layer including a significant amount of silicon, while other materials, such as germanium, carbon or other semiconductor materials, may also be incorporated therein. For example, a semiconductor layer comprising 50 atomic percent or more silicon may be considered as a silicon-based semiconductor layer.

In one illustrative embodiment, the semiconductor device 100 comprises a buried insulating layer 102 on which may be formed the semiconductor layer 103 so as to form an SOI architecture. The buried insulating layer 102 may be comprised of any appropriate material, such as silicon dioxide, silicon nitride or a combination thereof, or any other suitable dielectric materials. An isolation trench 105 is formed in the semiconductor layer 103 and extends, in one illustrative embodiment, down to the buried insulating layer 102, thereby defining a semiconductor region 110 in the layer 103, which may be bordered by the isolation trench 105. Moreover, at this manufacturing stage, the semiconductor device 100 comprises a layer 104 comprised of a non-oxidizable material, which is formed on exposed surface portions of the device 100 and thus on sidewalls 105S and a bottom 105B of the isolation trench 105. In one illustrative embodiment, the layer 104 may be comprised of silicon nitride, whereas, in other illustrative embodiments, other materials, such as silicon carbide and the like, may be used. A thickness of the layer 104 may be appropriately selected with respect to the trench dimensions and in view of the stopping characteristics of the layer 104 in a subsequent chemical mechanical polishing (CMP) process for removing any excess material that has to be filled into the isolation trench 104 in a later manufacturing stage. For example, the layer 104 may have a thickness of approximately 5-50 nm, depending on the device requirements.

A typical process flow for forming the semiconductor device 100 as shown in FIG. 1a may comprise the following processes. After providing the substrate 101 having formed thereon the semiconductor layer 103, or by forming the semiconductor layer 103 above the substrate 101, for instance by well-established wafer bond techniques when an SOI architecture is considered, or by epitaxial growth techniques, a photolithography process may be performed on the basis of well-established recipes to provide an appropriate resist mask or hard mask (not shown) on the basis of which an etch process may be performed in order to etch through the semiconductor layer 103, wherein, in some illustrative embodiments, the etch process may stop in or on the buried insulating layer 102. Appropriate etch techniques for the formation of the isolation trench 104 are well established in the art. After the etch process and removal of any mask layers, such as a resist mask, the layer 104 may be deposited, wherein, in one illustrative embodiment, well-established chemical vapor deposition (CVD) techniques on the basis of a low pressure ambient may be used in order to form a silicon nitride layer having the desired thickness. In other illustrative embodiments, as will be discussed later on, other appropriate deposition techniques may be used, such as plasma enhanced chemical vapor deposition (PECVD) in order to provide the layer 104 with an intrinsic mechanical stress on the basis of suitably controlling certain deposition parameters.

Figure 1B:
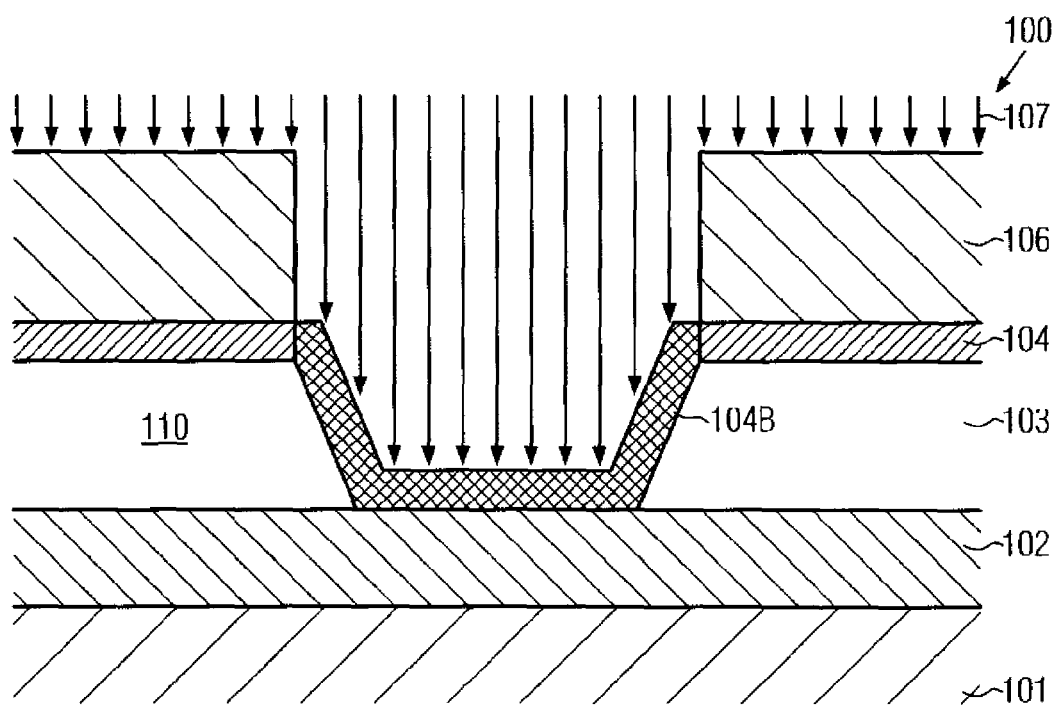

FIG. 1b schematically shows the semiconductor device 100 at a further advanced manufacturing stage, in which a mask 106, such as a resist mask, may be formed above the device 100 in such a manner that at least the isolation trench 105 is exposed. In other illustrative embodiments, the resist mask 106 may be omitted at this manufacturing stage or the resist mask 106 may be designed such that at least other isolation trenches may be covered, for which the intrinsic stress provided by the layer 104 is not to be modified, as will be discussed later on in more detail. Omitting the resist layer 106 in this manufacturing stage may lead to a common treatment of any exposed isolation trench provided in the device 100. Moreover, the device 100 as shown in FIG. 1b is subjected to a surface treatment 107 on the basis of an ion bombardment which, in one illustrative embodiment, may be established by performing an ion implantation process. For this purpose, any appropriate ion species may be used, such as inert species in the form of noble gas ions, or nitrogen, silicon, germanium and the like. It should be appreciated that appropriate process parameters, such as dose and implantation energy when the treatment 107 is carried out in the form of an ion implantation, may be readily established on the basis of test runs, simulation and the like. In some illustrative embodiments, when the mask 106 may not be provided, process parameters of the treatment 107, such as implantation energy, may be selected such that undue damage of the underlying semiconductor region 110 may be substantially avoided. In other illustrative embodiments, any implantation-induced damage that may be caused in the semiconductor region 110 may be re-crystallized in a later phase during a high temperature processing, for instance during the densification of an insulating material to be filled into the isolation trench 105.

During the treatment 107, exposed portions 104B of the layer 104, which may extend horizontally beyond the isolation trench 105, or substantially the whole layer 104 may be represented by the exposed portion 104B, may be modified in their crystalline structure, wherein, in the case of a silicon nitride layer, a significant amount of silicon and nitrogen bonds are destroyed, thereby significantly affecting the mechanical characteristics of the exposed layer portions, wherein process parameters may be selected to effect the modification up to any desired depth including the total thickness of the portion 104B. Hence, the exposed portion of the layer 104 may be made porous to a certain degree, thereby providing the potential for providing additional diffusion paths during a subsequent treatment to increase the compressive stress of the exposed layer portion.

Figure 1C:
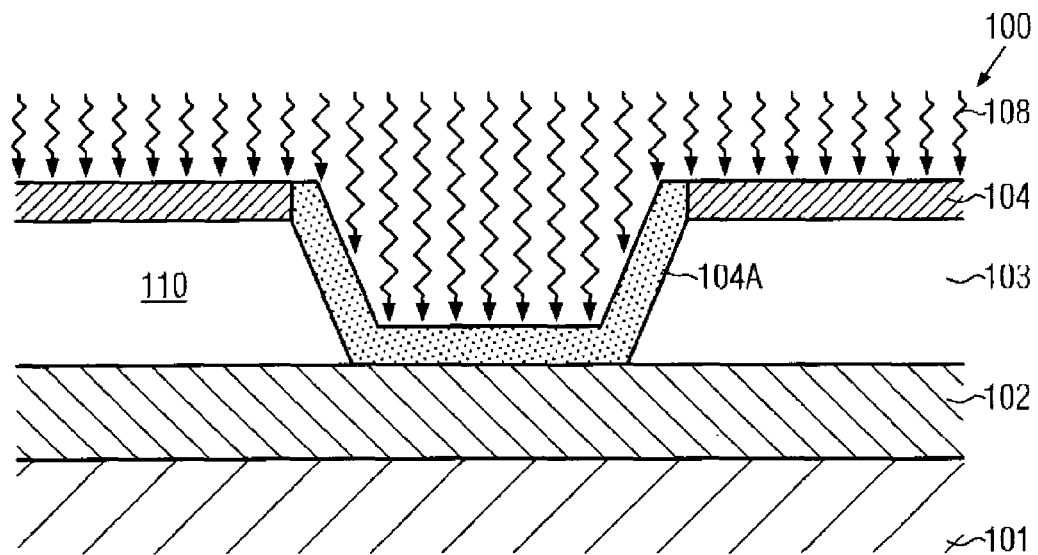

FIG. 1c schematically shows the semiconductor device 100 after the removal of the mask 106, if provided, and during a further treatment 108, which may be performed in an oxidizing ambient. In one illustrative embodiment, the ambient 108 may be established on the basis of oxygen and/or ozone at elevated temperatures in the range of approximately 500-1100° C., when the duration of the treatment 108 may be based on the required amount of oxide formation. For example, a duration of several seconds to several hours may be used, wherein a target treatment time may be readily determined on the basis of test results of test substrates and/or product substrates. In still other illustrative embodiments, the ambient 108 may be established on the basis of a plasma, wherein additionally a high degree of directionality of oxygen or ozone ions may be achieved, thereby potentially enhancing the effectiveness of oxygen diffusion into the previously modified portion of the layer 104. During the diffusion of oxygen into the modified portion of the layer 104 and based on the elevated temperature, the oxygen may readily react with free silicon provided by the previous treatment 107, thereby building up an increasing amount of silicon dioxide in the exposed layer portion of the layer 104 and thus forming a portion 104A having an increased compressive stress due to the increased volume of silicon dioxide compared to silicon. It should be appreciated that, in the embodiments shown, the increased oxygen diffusion is substantially restricted to the exposed portions previously treated by the treatment 107, since non-treated portions may still have a high degree of structural integrity, thereby significantly reducing or substantially preventing any oxygen diffusion during the treatment 108 in the oxidizing ambient. For example, silicon nitride may efficiently block oxygen diffusion even at very high temperatures. In other illustrative embodiments, when significant portions of the layer 104 may have been exposed to the treatment 107, or when the mask 106 has completely been omitted during the preceding treatment 107, the corresponding oxygen diffusion may also occur in horizontal portions of the layer 104.

Figure 1D:
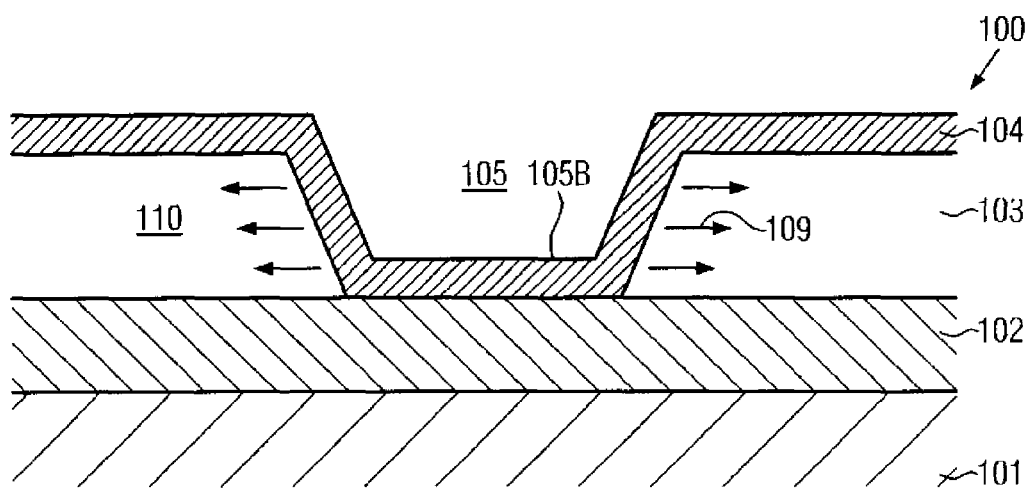

FIG. 1d schematically shows the semiconductor device 100 after the completion of the treatment 108 in the oxidizing ambient so that the exposed portion 104A now comprises a significant compressive stress 109, which may then be highly efficiently transferred into the semiconductor region 110. It should be appreciated that the resulting compressive stress 109 is also efficiently transferred into the buried insulating layer 102, thereby also transferring a respective compressive stress into the buried insulating layer 102 located below the semiconductor region 110. A corresponding stress transfer mechanism may be highly advantageous in the context of highly sophisticated fully or partially depleted transistor devices, wherein charge carrier transport may also take place at an interface between the region 110 and the buried insulating layer 102, when a transistor is formed in the region 110.

Figure 1E:
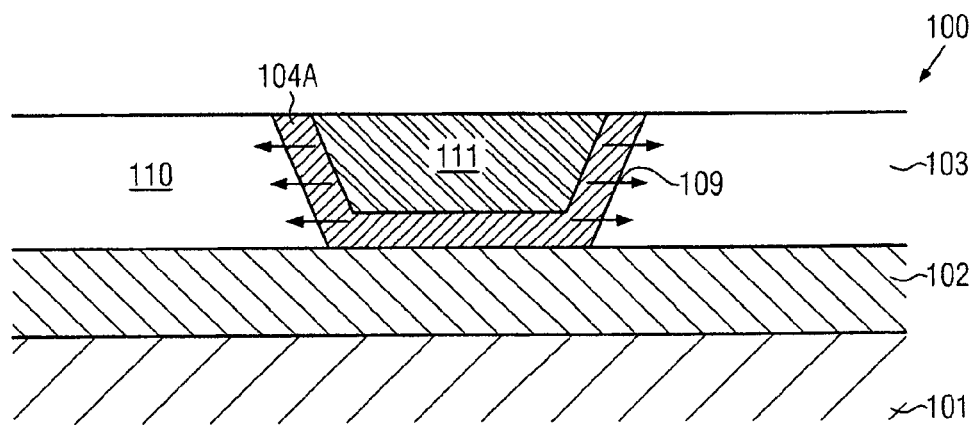

FIG. 1e schematically shows the semiconductor device 100 in a further advanced manufacturing stage. The isolation trench 105 is filled with an insulating material 111, which in one illustrative embodiment is silicon dioxide, thereby providing a high degree of compatibility with conventional process techniques. The insulating material 111 may be deposited on the basis of any appropriate technique, such as CVD on the basis of TEOS or any other deposition regime. During the deposition process, excess material may be provided to reliably fill the isolation trench 105. Thereafter, the excess material may be removed by any appropriate planarization technique, such as chemical mechanical polishing (CMP), wherein the layer 104, i.e., horizontal portions thereof, may serve as a CMP stop layer to reliably control the removal of the excess material of the insulating material 111. For the embodiments illustrated in FIGS. 1a-1d, the structural integrity of the layer 104 as deposited may have been maintained at the horizontal portions, thereby substantially not affecting the respective characteristics during the CMP process. In other embodiments, when significant portions of the layer 104 may have experienced the treatment 107 and may thus have included therein a significant amount of silicon dioxide, the stopping characteristics of the layer 104 may be less pronounced, while a significant difference with respect to the insulating material 111 may nevertheless provide a high degree of controllability in the CMP process.

Prior to or after the CMP process, a heat treatment may be performed to impart an increased density to the insulating material 111, while, in other embodiments, a corresponding densification may be omitted. In one embodiment, the heat treatment for densifying the insulating material may be carried out in an oxidizing ambient, thereby further increasing the oxygen diffusion into the portion 104A, which may result in a further increased compressive stress. After the CMP process, the remaining portion of the layer 104 outside the isolation trench 105 may be removed on the basis of a selective etch process, which may be based on hot phosphoric acid, when the layer 104 outside the isolation trench 105 may have not been treated during the process 107 and when the layer 104 is substantially comprised of silicon nitride. In this case, the initial characteristics of the silicon nitride layer are substantially maintained and thus the layer 104 may be efficiently removed by well-established recipes with hot phosphoric acid. During this selective etch process, the modified portion 104A may exhibit a reduced etch rate due to the increased amount of silicon dioxide contained therein, so that undue erosion of the material of the portion 104A may be reduced or may be substantially suppressed. Consequently, a highly reliable isolation trench 105 is provided, wherein the magnitude of the compressive stress 109 may be adjusted on the basis of process parameters regarding the treatments 107 and 108 and possibly a heat treatment for densifying the insulating material 111.

Figure 1F:
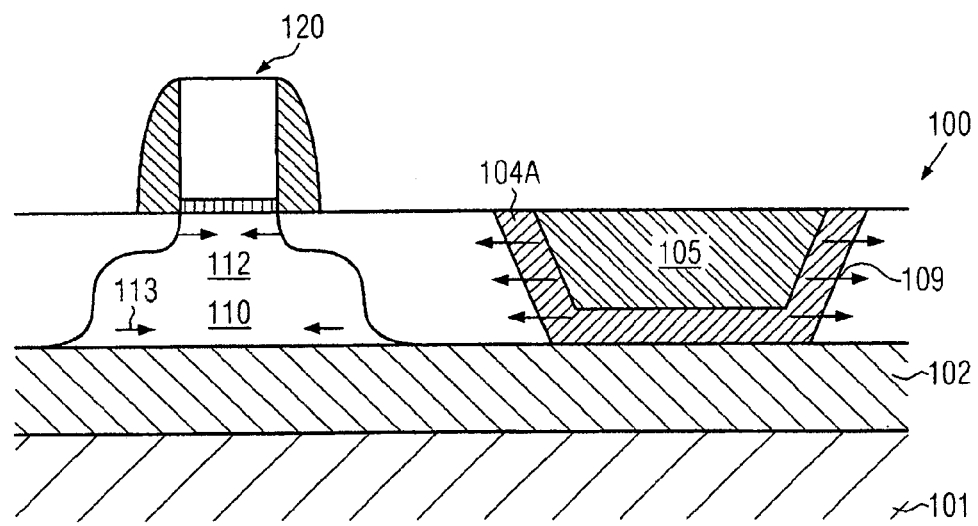

FIG. 1f schematically shows the semiconductor device 100 in a further advanced manufacturing stage, wherein a transistor element 120 is formed in and above the semiconductor region 110. The transistor 120 may comprise a channel region 112, which may have a strained crystalline structure due to a strain 113 caused by the high compressive stress 109 provided by the isolation trench 105. For example, the transistor 120 may represent, in one illustrative embodiment, a P-channel transistor so that the compressive strain 113 may positively influence the carrier mobility of the holes in the channel region 112, thereby improving the transistor performance.

Figure 2:
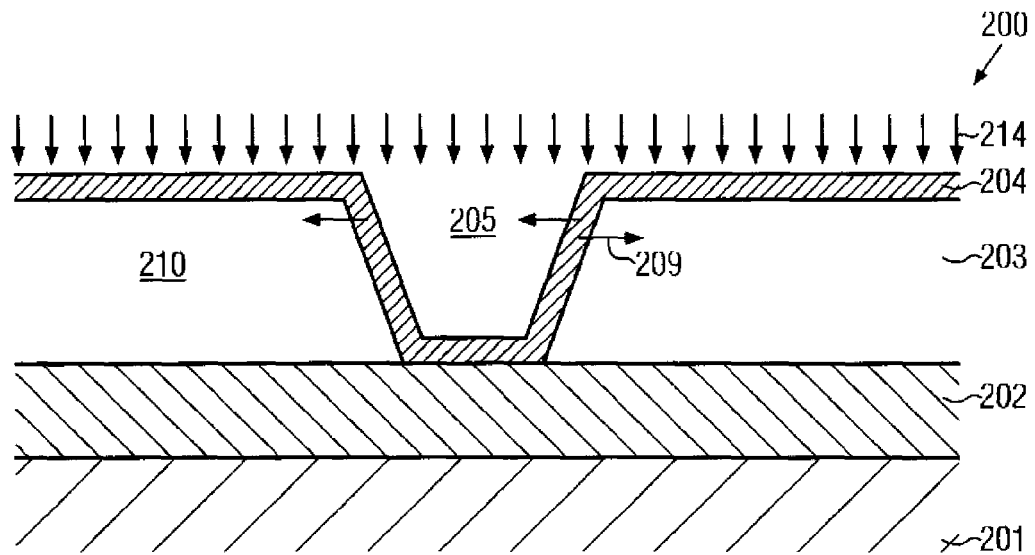
FIG. 2 schematically illustrates a cross-sectional view of a semiconductor device during the formation of an isolation trench by means of a liner material having an intrinsic stress.

FIG. 2 schematically shows a cross-sectional view of a semiconductor device 200 in accordance with further illustrative embodiments, wherein a respective insulating liner may be formed on the basis of a deposition technique that enables the creation of a high magnitude of intrinsic stress. The device 200 comprises a substrate 201, above which is formed a semiconductor layer 203, wherein, in illustrative embodiments, a buried insulating layer 202 may be provided between the substrate 201 and the layer 203. Furthermore, an isolation trench 205 is formed in the layer 203, thereby bordering a semiconductor region 210, in and over which respective transistor elements are to be formed. Regarding the individual components 201, 202, 203 and 210, the same criteria apply as previously explained with reference to the device 100. Furthermore, a layer 204 is formed above the semiconductor layer 203 and within the isolation trench 205. The layer 204 may be comprised of silicon nitride, which may be formed on the basis of a PECVD process 214, in which process parameters, such as pressure, temperature, plasma power, bias power for adjusting a directionality of ions in the ambient of the process 214 and the like, may be appropriately controlled to provide the layer 204 with a desired type and magnitude of intrinsic stress. Silicon nitride may be efficiently deposited with a high amount of compressive or tensile stress with a magnitude ranging up to 1.5 GPa (GigaPascal) by appropriately selecting the deposition parameters specified above. Thus, in one illustrative embodiment, the layer 204 may be deposited to exhibit a high compressive stress 209, whereas, in other illustrative embodiments, the layer 204 may be provided with tensile stress.

In some illustrative embodiments, an additional CMP stop layer (not shown) may be provided prior to forming the isolation trench 205, when the deposition process 214 may be considered inappropriate for providing a required high degree of conformity to establish a desired degree of thickness conformity on horizontal portions of the layer 203. For example, the additional CMP stop layer may have an even higher mechanical integrity, when for instance provided as silicon carbide, compared to silicon nitride, thereby providing the possibility to reliably remove excess material of the layer 204 by CMP, which may then be controlled on the basis of the additional CMP stop layer. In other illustrative embodiments, the thickness uniformity achieved by the deposition process 214 at least at the horizontal surface portions of the device 200 may be considered appropriate to provide reliable CMP control, wherein the remaining excess material of the layer 204 may then be removed by an appropriate selective etch process in conformity with a process sequence as previously described with reference to the device 100.

Thereafter, the further processing may be continued as is described above, i.e., the isolation trench 205 may be filled with an appropriate insulating material, such as silicon dioxide, and further processing may be continued by removing any excess material which, as previously explained, may be based on an additional CMP stop layer, or which may be performed on the basis of the layer 204 as deposited. Thereafter, a transistor element may be formed in and above the region 210, wherein the high compressive stress 209 also provides a corresponding transistor performance as is also described with reference to the transistor 120. Similarly, the layer 204 may be formed with a high intrinsic tensile stress in order to provide a respective tensile stress to the region 210, depending on process and device requirements.

Figure 3A:
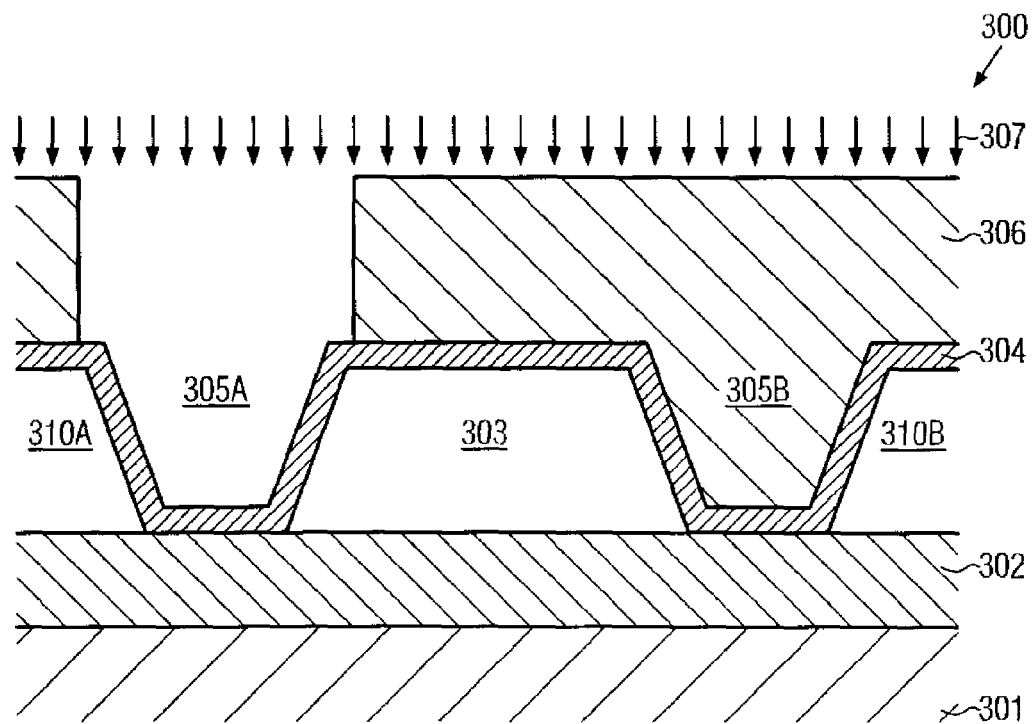
FIGS. 3a-3d schematically illustrate cross-sectional views of a semiconductor device having differently stressed isolation trenches during various manufacturing stages in accordance with yet other illustrative embodiments of the present invention.
Figure 3B:
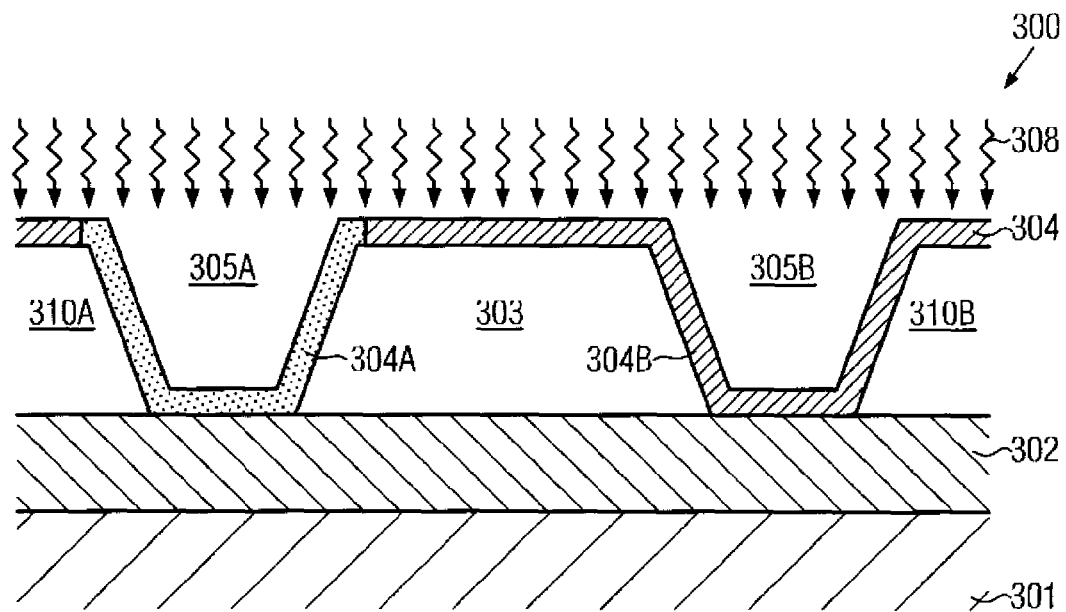
Figure 3C:
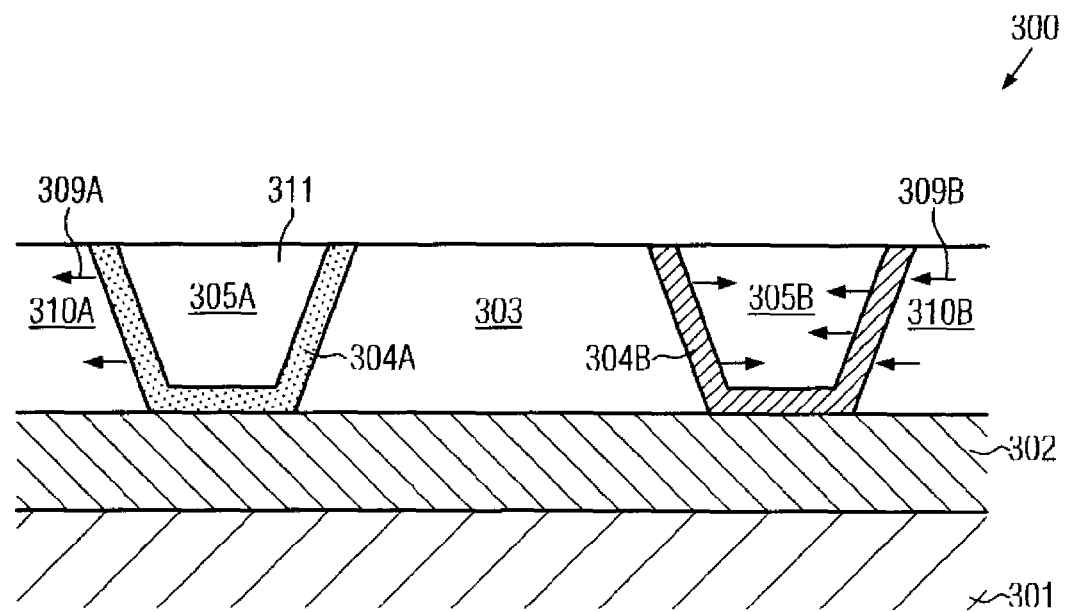

With reference to FIGS. 3a-3c, further illustrative embodiments of the present invention will now be described in more detail, in which a different type or magnitude of intrinsic stress may be provided by different isolation trenches.

In FIG. 3a, the semiconductor device 300 comprises a substrate 301, above which is formed a semiconductor layer 303, wherein, in illustrative embodiments, a buried insulating layer 302 may be formed between the substrate 301 and the layer 303. With respect to specifics of the components 301, 302, 303, it is referred to the corresponding components as described with reference to FIGS. 1a-1f. The device 300 further comprises a first isolation trench 305A and a second isolation trench 305B, which respectively define a first semiconductor region 310A and a second semiconductor region 310B. Moreover, a layer 304 is formed above the semiconductor layer 303 and within the first and second isolation trenches 305A, 305B. The layer 304 may be comprised of a non-oxidizable material, which in one illustrative embodiment is represented by silicon nitride. In one embodiment, the layer 304 may have an intrinsic stress, such as tensile or compressive stress of a desired magnitude. For example, the layer 304 may have a relatively low magnitude of intrinsic stress, while in other embodiments a moderately high magnitude of intrinsic stress may be provided, depending on the further process strategy. Furthermore, the semiconductor device 300 may be covered by a mask layer 306, which may expose the first isolation trench 305A while covering the second isolation trench 305B.

The device 300 as shown in FIG. 3a may be formed in accordance with substantially the same processes as are previously described with reference to the device 100. Moreover, it should be appreciated that, depending on the desired type and magnitude of intrinsic stress of the layer 304, any appropriate deposition technique may be used. For example, in some illustrative embodiments, the PECVD technique described with reference to FIG. 2, i.e., the process 214, may be used to form the layer 304 having a high tensile or compressive stress, depending on process and device requirements. In still other illustrative embodiments, low pressure chemical vapor deposition (LPCVD) techniques may be used in accordance with well-established recipes. Thereafter, the mask 306, for instance in the form of a resist mask, may be formed on the basis of well-established photolithography techniques. Thereafter, the device 300 may be subjected to a treatment 307, which in one embodiment may represent an ion bombardment to modify the exposed portion of the layer 304 within the first isolation trench 305A. That is, a similar treatment as the treatment 107 may be performed, thereby reducing the mechanical integrity of the exposed layer portion in the first isolation trench 305A. Depending on the initial characteristics of the layer 304, any intrinsic stress contained therein may be significantly relaxed due to the treatment 307. For example, if the layer 304 is initially provided with a high magnitude of compressive or tensile stress, a significant stress relaxation may be obtained by the treatment 307.

FIG. 3b schematically shows the semiconductor device 300 after the completion of the treatment 307 and the removal of the mask 306. Moreover, the device 300 may be exposed to an oxidizing ambient 308 at elevated temperatures, wherein the ambient 308 may be similar to the ambient 108 previously described. During the treatment 308, previously exposed portions in the first isolation trench 305A may be further modified to form a modified portion 304A, in which, for instance, an increased amount of oxygen may be incorporated into the layer portion 304A, thereby providing increased compressive stress, as is previously explained. In other illustrative embodiments, the semiconductor device 300 may not be subjected to the treatment 308 when the layer 304 is initially provided with a high intrinsic stress and the stress relaxation obtained by the treatment 307 is considered appropriate for the stress engineering within the semiconductor region 310A adjacent to the first isolation trench 305A. It should be appreciated that similarly to the treatment 108, also in this case the previously modified portions, which were not exposed to the treatment 307, may substantially maintain their initial mechanical integrity and thus their initial stress characteristics. Consequently, the second isolation trench 305B may have a substantially non-modified portion 304B.

FIG. 3c schematically illustrates the semiconductor device 300 in a further advanced manufacturing stage, in which the first and second isolation trenches 305A, 305B are filled with an appropriate insulating material 311, such as silicon dioxide, which may have been deposited on the basis of well-established recipes followed by the removal of any excess material, thereby planarizing the topography of the device 300, wherein the layer 304 may also act as a CMP stop layer, as previously described. Consequently, the first isolation trench 305A may have a high compressive stress 309A acting on the adjacent semiconductor region 310A. Similarly, the second isolation trench 305B may exhibit, in some illustrative embodiments, a substantially low intrinsic stress depending on the initial stress characteristics of the layer 304 or, in other illustrative embodiments, even a moderately high tensile stress 309B may be exerted to the adjacent semiconductor region 310B, when the initial layer 304 has been deposited so as to exhibit a high tensile stress.

Figure 3D:
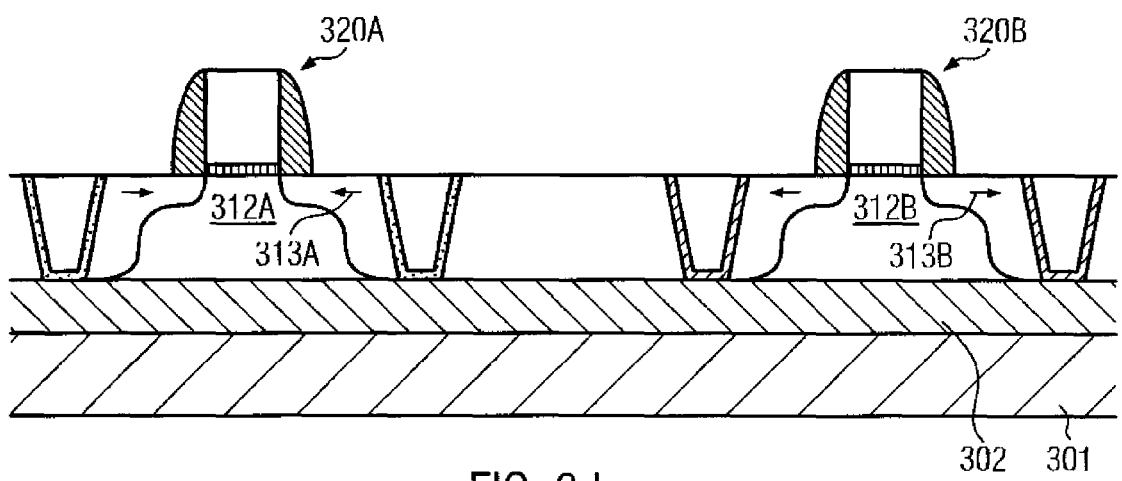

FIG. 3d schematically shows the semiconductor device 300 in a further advanced manufacturing stage, in which a first transistor element 320A is formed in and on the first semiconductor region 310A, while a second transistor 320B is formed in an on the second semiconductor region 310B. Consequently, a respective stress transfer from the first isolation trench into a channel region 312A of the first transistor 320A may be achieved, thereby inducing a first strain 313A in the channel region 312A. Similarly, a different type or magnitude of strain 313B may be induced in the channel region 312B of the second transistor element 320B. For example, when the first strain 313A is a compressive strain, the first transistor may represent a P-channel transistor. Similarly, when the second strain 313B is a reduced compressive strain or a tensile strain, the second transistor 320B may represent an N-channel transistor.

As a result, the present invention provides an efficient strain-inducing mechanism on the basis of a stress engineering technique applied to isolation trenches, wherein, in advanced applications requiring SOI architectures, a highly efficient stress transfer may be accomplished by providing respectively designed liner materials in the isolation trenches. For this purpose, the characteristics of a non-oxidizable layer may be efficiently modified to incorporate a significant amount of silicon dioxide, thereby providing the potential for generating a high compressive stress in a highly controllable fashion. In other illustrative embodiments, additionally or alternatively, the liner material may be deposited to exhibit a high intrinsic stress, wherein the type and the magnitude may be substantially determined on the basis of deposition parameters. Thereafter, the intrinsic stress may be selectively modified or even enhanced to provide an increased degree of design and process flexibility. For example, compressive stress may be generated in the vicinity of P-channel transistors, while, in some illustrative embodiments, additionally, tensile stress or a reduced compressive stress may be created adjacent to N-channel transistors, thereby significantly enhancing the performance thereof. As a consequence, a highly efficient strain-inducing mechanism is provided, wherein, in advanced SOI architectures, the stress transfer may be obtained over the entire depth of the respective semiconductor layer. Moreover, the enhanced stress engineering techniques of the present invention based on modifying a liner material of isolation trenches may be efficiently combined with other stress engineering techniques previously discussed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a non-oxidizable layer within an isolation trench formed in a Semiconductor layer located above a substrate;
   selectively modifying said non-oxidizable layer within said isolation trench by treating at least a portion of said non-oxidizable layer by an ion bombardment and exposing said portion to an oxidizing ambient after said ion bombardment and prior to depositing any insulating material in said isolation trench to generate compressive stress;
   filling said isolation trench with said insulating material after selectively modifying said non-oxidizable layer to generate said compressive stress; and
   forming a transistor element adjacent to said isolation trench, said compressive stress inducing a lattice strain in said transistor element.

2. The method of claim 1, wherein said non-oxidizable layer comprises silicon and nitride.

3. The method of claim 2, wherein selectively modifying said non-oxidizable layer comprises forming a mask layer to expose said non-oxidizable layer within said isolation trench and treating said exposed portion of said non-oxidizable layer by said ion bombardment.

4. The method of claim 3, wherein said oxidizing ambient is an oxidizing plasma ambient.

5. The method of claim 1, wherein said ion bombardment is generated by an ion implantation process.

6. A method, comprising:
   depositing a non-oxidizable layer having an intrinsic stress above a first isolation trench and a second isolation trench, said first and second isolation trenches being formed in a semiconductor layer;
   selectively modifying said intrinsic stress of said non-oxidizable layer in said first isolation trench by treating said non-oxidizable layer in said first isolation trench by an ion bombardment and exposing said non-oxidizable layer to an oxidizing ambient after said ion bombardment and prior to depositing any insulating material in said first isolation trench to generate compressive stress in said non-oxidizable layer; and filling said first and second isolation trenches with said insulating material after selectively modifying said non-oxidizable layer to generate said compressive stress.

7. The method of claim 6, wherein said oxidizing ambient is an oxidizing plasma ambient.

8. The method of claim 6, wherein said ion bombardment is generated by an ion implantation process.

9. The method of claim 6, wherein said non-oxidizable layer comprises silicon and nitride.

10. The method of claim 6, wherein said non-oxidizable layer is deposited with an intrinsic tensile stress.

11. The method of claim 6, further comprising forming a first transistor in a first semiconductor region bordered by said first isolation trench and forming a second transistor in a second semiconductor region bordered by said second isolation trench.

12. The method of claim 11, wherein said first transistor is a P-channel transistor and said second transistor is an N-channel transistor.

* * * * *